(12) United States Patent
Peabody

(10) Patent No.: US 9,755,365 B2
(45) Date of Patent: Sep. 5, 2017

(54) MODULAR SOCKET

(71) Applicant: Astronics Advanced Electronic Systems Corp., Kirkland, WA (US)

(72) Inventor: Mark A. Peabody, Redmond, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 0 days.

(21) Appl. No.: 14/984,462

(22) Filed: Dec. 30, 2015

(65) Prior Publication Data

US 2016/0204549 A1   Jul. 14, 2016

Related U.S. Application Data

(60) Provisional application No. 62/100,972, filed on Jan. 8, 2015.

(51) Int. Cl.
| | | |
|---|---|---|
| H01R 25/00 | (2006.01) | |
| H01R 13/633 | (2006.01) | |
| H01R 31/06 | (2006.01) | |
| H01R 24/58 | (2011.01) | |
| H01R 24/60 | (2011.01) | |
| H01R 43/16 | (2006.01) | |
| H05K 1/11 | (2006.01) | |
| H01R 107/00 | (2006.01) | |
| H01R 13/24 | (2006.01) | |

(Continued)

(52) U.S. Cl.
CPC .......... *H01R 13/633* (2013.01); *H01R 24/58* (2013.01); *H01R 24/60* (2013.01); *H01R 31/06* (2013.01); *H01R 43/16* (2013.01); *H05K 1/111* (2013.01); *H01R 13/2421* (2013.01); *H01R 13/56* (2013.01); *H01R 13/6277* (2013.01); *H01R 2107/00* (2013.01)

(58) Field of Classification Search
CPC ..... H01R 13/514; H01R 31/06; H01R 24/542
USPC ................................................. 439/638, 928
See application file for complete search history.

(56) References Cited

U.S. PATENT DOCUMENTS

| | | | |
|---|---|---|---|
| 1,684,915 | A | 9/1928 | Giles et al. |
| 2,170,287 | A | 8/1937 | Kinnebrew |

(Continued)

FOREIGN PATENT DOCUMENTS

| | | | |
|---|---|---|---|
| EP | 2190078 A1 | 5/2010 | |
| WO | 03005493 A1 | 1/2003 | |

(Continued)

OTHER PUBLICATIONS

EP 16150222, European Search Report, published by European Patent Office, dated May 24, 2016.

*Primary Examiner* — Vanessa Girardi
(74) *Attorney, Agent, or Firm* — Wiggin and Dana LLP; Gregory S. Rosenblatt; Jonathan D. Hall

(57) ABSTRACT

An electrical connector including a holding device, that has a recess and at least one conductive pad disposed therein, and a socket that has at least one conductive pin configured to engage at least one of the conductive pads when the socket is inserted into the holding device and a port configured to receive an interface of an external device. The shape of the socket is complementary to the shape of the recess. A first retaining element included in the holding device and a second retaining element included in the socket are together releasably maintain interconnection between the holding device and the socket.

20 Claims, 4 Drawing Sheets

(51) Int. Cl.
*H01R 13/56* (2006.01)
*H01R 13/627* (2006.01)

(56) References Cited

U.S. PATENT DOCUMENTS

| | | | |
|---|---|---|---|
| 3,521,216 A | 7/1970 | Tolegian | |
| 3,649,742 A | 3/1972 | Tissot | |
| 3,808,577 A | 4/1974 | Mathauser | |
| 3,816,679 A | 6/1974 | Hotchkiss | |
| 3,900,239 A | 8/1975 | Anhalt et al. | |
| 4,211,456 A | 7/1980 | Sears | |
| 4,317,969 A | 3/1982 | Riegler et al. | |
| 4,719,549 A | 1/1988 | Apel | |
| 4,874,316 A | 10/1989 | Kamon et al. | |
| 5,401,175 A * | 3/1995 | Guimond | H01R 13/6205 439/38 |
| 6,358,076 B1 | 3/2002 | Haag | |
| 6,910,911 B2 | 6/2005 | Mellott et al. | |
| 7,056,127 B2 | 6/2006 | Suzuki et al. | |
| 7,074,046 B2 | 7/2006 | Kernan | |
| 7,114,966 B2 | 10/2006 | Cecchi | |
| 7,192,303 B2 | 3/2007 | Kohen | |
| 7,311,526 B2 | 12/2007 | Rohrbach et al. | |
| 7,354,315 B2 | 4/2008 | Goetz et al. | |
| 7,607,920 B1 | 10/2009 | Chen | |
| 7,798,831 B2 | 9/2010 | Sanford et al. | |
| 7,857,664 B2 | 12/2010 | Waryck et al. | |
| 7,963,802 B2 | 6/2011 | Corneille et al. | |
| 8,105,091 B2 | 1/2012 | Nishihira et al. | |
| 8,162,691 B2 * | 4/2012 | Chang | H01R 12/724 439/541.5 |
| 8,408,924 B1 * | 4/2013 | Queru | H01R 31/06 439/136 |
| 8,608,502 B2 | 12/2013 | Witter et al. | |
| 2009/0091292 A1 | 4/2009 | Nippear et al. | |
| 2013/0017703 A1 | 1/2013 | Gamelsky et al. | |
| 2013/0164985 A1 | 6/2013 | Cong et al. | |
| 2014/0099808 A1 | 4/2014 | McClelland | |

FOREIGN PATENT DOCUMENTS

| | | |
|---|---|---|
| WO | 2005/053100 A2 | 6/2005 |
| WO | 2012/158616 A2 | 11/2012 |
| WO | 2013/052697 A2 | 4/2013 |

* cited by examiner

MODULAR SOCKET

CROSS REFERENCE TO RELATED APPLICATION

This application is a non-provisional that claims a benefit to U.S. Provisional Patent Application No. 62/100,972, entitled "Pop-Out Socket Connector" that was filed on Jan. 8, 2015. The contents of U.S. 62/100,972 are hereby incorporated by reference herein in their entirety.

BACKGROUND

Electrical connectors, such as those facilitating power or data transfer between two devices, are often intolerant of separating forces on axes other than those normal to the connection between them. Components such as connectors and sockets are subject to potential damage by virtue of the rigidity of the components and the tight frictional fits between them. With technology advancing to the point where electronic devices are so easily transportable, there is increased need to protect delicate connection components from instances where a user mistakenly attempts to separate two devices without first severing the connection between them. The intolerance of connectors and sockets to non-normal forces can easily result in bent or broken components in need of repair or replacement.

Some prior art electrical connectors attempted to solve these issues by joining the connector ends magnetically. U.S. Pat. No. 7,056,127, incorporated herein by reference in its entirety, discloses the use of an adaptor to be retained in a traditional electrical connector, wherein the adaptor was further magnetically joined to a plug body and a cable connected to an external device.

U.S. Pat. No. 4,719,549 and U.S. Pat. No. 4,311,456, also incorporated herein by reference in their entireties, eschewed the frictional fit between electrical connectors in favor of a spherical connector magnetically joined to a complementary recessed socket.

Other prior art electrical connectors have disclosed adaptor devices which establish a releasable mechanical connection between connectors and sockets. US 2013/0017703, incorporated herein by reference in its entirety, discloses such a device.

What is desired therefore is a socketed connector that itself limits the damage inflicted on connection components when forces are exerted on them from an axis not normal to the socket.

BRIEF SUMMARY OF THE INVENTION

The details of one or more embodiments of the invention are set forth in the accompanying drawings and the description below. Other features, objects and advantages of the invention will be apparent from the description and drawings, and from the claims.

The present disclosure provides for a socket connector system including a holding device and releasable socket. In some embodiments, an electrical connection is provided between the holding device and releasable socket. In some embodiments, the holding device and socket assembly includes a retaining element that enables the socket to be inserted and retained within the holding device, but also easily removed through application of a force in any axis. In some embodiments, a port is included on the socket, thus enabling an external device to be connected to the socket and subsequently through the holding device to a printed circuit board.

DETAILED DESCRIPTION

Disclosed herein is a system that provides a releasable connection between an external device and a printed circuit board.

Figure 1:
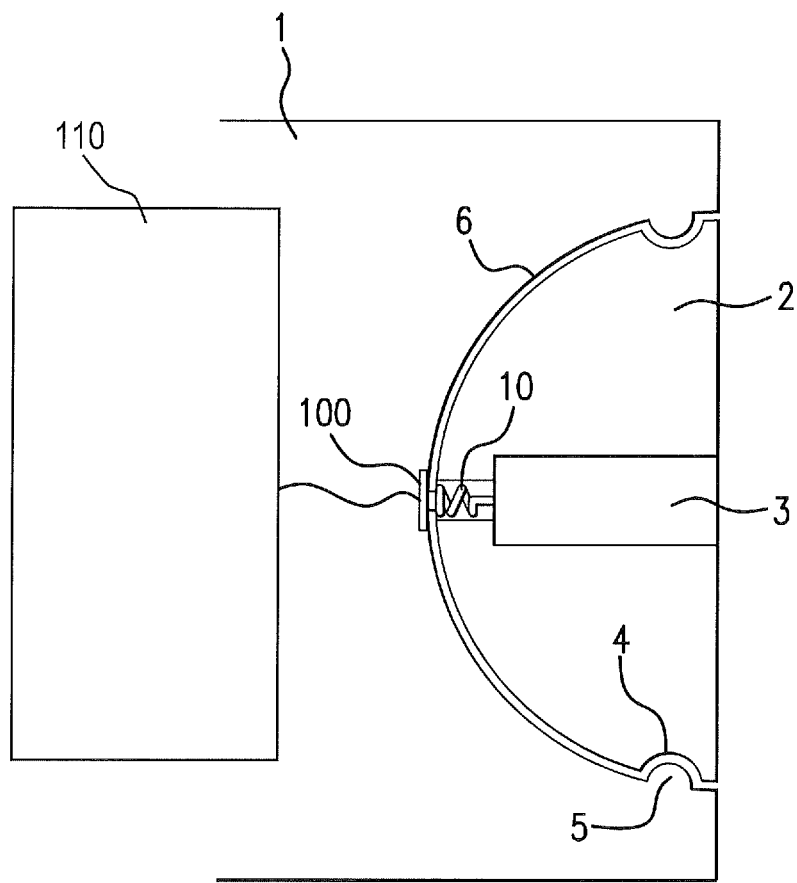
FIG. 1 shows a side view of an embodiment of a pop-out socket connector.

In one embodiment, as shown in FIG. 1, the system includes a holding device 1 and a socket 2. Holding device 1 includes a recess 6 for accepting socket 2 into holding device 1. In some embodiments, recess 6 and socket 2 are complementary shapes. FIG. 1 depicts one embodiment where recess 6 and socket 2 are complementary hemispherical shapes, although any pair of complementary shapes may be suitable for use in the system of the present disclosure. In some embodiments, the bodies of holding device 1 and socket 2 are composed primarily of plastic.

Figure 2:
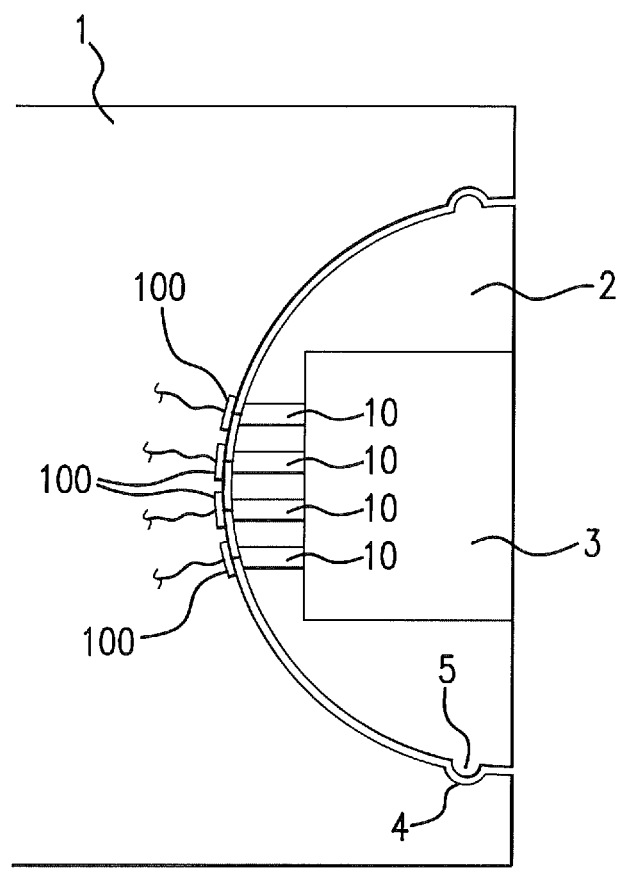
FIG. 2 shows a top view of the pop-out socket connector shown in FIG. 1.

In some embodiments, an electrical connection is provided between holding device 1 and socket 2 through contact pads 100 and connector pins 10. In some embodiments, the contact pads 100 are further electrically connected to a printed circuit board 110 or other electrical system. FIG. 2 shows an embodiment wherein 4 pairs of contact pads 100 and connector pins 10 are employed to provide electrical connection between holding device 1 and socket 2, though other embodiments may provide any suitable number of contact pads 100 and connector pins 10 to establish connection between an external device and a printed circuit board, as will be discussed in greater detail below. In some embodiments, connector pins 10 are spring mounted. In some embodiments, the printed circuit board and holding device may be disposed on an aircraft, automobile, laptop, or any other location which may benefit from having a connection with an external device.

Holding device 1 and socket 2 are mechanically joined together using a retaining element. In some embodiments, holding device 1 and socket 2 are mechanically joined together using complementary ring structures 4 and 5 included on socket 2 and holding device 1 respectively. In the exemplary embodiment shown in FIG. 1, a raised ring 5 is included about a perimeter of holding device 1. A recessed ring 4 is included about a perimeter of socket 2. Raised ring 5 and recessed ring 4 are configured to engage one another when socket 2 is inserted into holding device 1. Raised ring 5 and recessed ring 4 are also configured so that when engaged, electrical contact is achieved between contact pads 100 and connector pins 10.

As shown in FIG. 2, the location of raised ring 5 is not limited to holding device 1 and the location of recessed ring 4 is not limited to socket 2. In some embodiments, raised ring 5 is included on socket 2 and recessed ring 4 is included on holding device 1. The location, orientation, shape, and size of raised ring 5 and recessed ring 4 are a matter of design choice, although in some embodiments the location, orientation, shape, and size of raised ring 5 and recessed ring 4 must enable a releasable fit between holding device 1 and socket 2, as discussed in greater detail below. In some embodiments, the releasable fit between socket 2 and holding device 1 is provided by retaining clips (not shown). In some embodiments, the raised ring is mounted on at least one positively biased spring (not shown).

Figure 3:
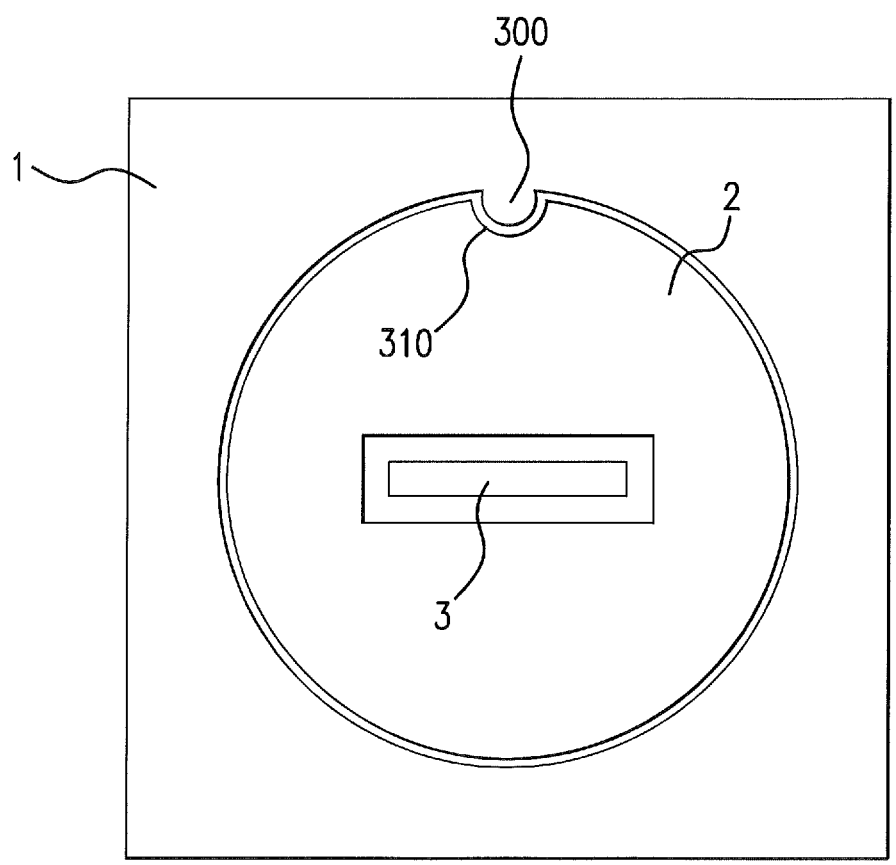
FIG. 3 shows a front view of a further embodiment of the pop-out socket connector shown in FIG. 1.

As shown in FIGS. 1-3, a port 3 is included on socket 2. In some embodiments, port 3 is disposed on a surface of socket 2 opposite holding device 1, such that when socket 2 is inserted into holding device 1, port 3 is open to receiving a connector. In some embodiments, port 3 is configured to accept a connector to an outside device. When all components are assembled, the system provides electrical connection from an external device through port 3 to socket 2 to holding device 1 to a printed circuit board. In some embodiments, port 3 is configured to facilitate connection of the desired external device. In some embodiments, port 3 is a USB connector, a power connector, a memory card connector, an audio connector, a video connector, and the like. In some embodiments, port 3 is compatible with the standard connector for the connection desired between the external device and the printed circuit board, e.g. port 3 is a standard USB port, a standard 3.5 mm audio jack, and the like. The advantage is that users will not need system specific adaptors to connect their external devices to the system of the present disclosure; the connectors already in use by the user, for instance when connecting the external device to a traditional laptop, can be used with the system.

As shown in FIG. 3, in some embodiments, protrusion 300 and groove 310 are included on holding device 1 and socket 2. Protrusion 300 and groove 310 are provided to limit the orientations in which socket 2 is insertable into holding device 1. In the embodiment shown in FIG. 3, protrusion 300 and groove 310 are complementary shapes that prevent insertion of socket 2 into holding device 1 unless protrusion 300 is accepted into groove 310 as well. Once socket 2 is inserted into holding device 1, protrusion 300 also prevents rotation of socket 2.

Figure 4:
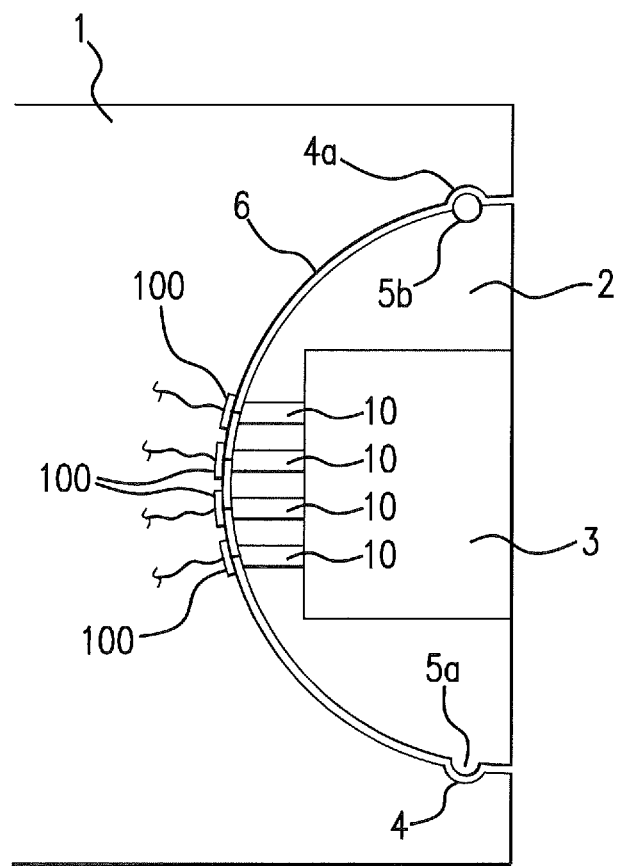
FIG. 4 shows a side view of an embodiment having a raised ring on the socket.

With reference to FIG. 4, in some embodiments, raised ring 5*a* and recessed ring 4 releasably retain socket 2 within holding device 1 through a frictional fit. In some embodiments, the raised ring 5*b* is a separate split ring spring that engages recess 4*a*. In some embodiments, holding device 1 and socket 2 are separated when sufficient forces are applied on the socket from any axis. When the forces exerted on socket 2 overcome the frictional forces between raised ring 5 and recessed ring 4, socket 2 releases from holding device 1. In some embodiments, forces required to remove socket 2 from holding device 1 are insufficient to cause damage to port 3 or any connector disposed between port 3 and an external device. For example, a user may have an external device in their jacket pocket which is connected to a female USB port in a socket located in the armrest of an airplane seat. Upon standing, traditional connections pull taut and potentially damage the connector, external device, or jacket as the user provides an upward force that is essentially matched by the frictional fit between the connectors. When employing the disclosed system, however, the upward forces provided by the user would simply overcome the releasable connection maintained by retaining rings 4 and 5*a* or 5*b*, causing the socket to pull free of the holding device before damage could be done to the connector, external device, or jacket. In some embodiments, a tool is necessary to refit socket 2 into holding device 1.

One or more embodiments of the present invention have been described. Nevertheless, it will be understood that various modifications may be made without departing from the spirit and scope of the invention. Accordingly, other embodiments are within the scope of the following claims.

What is claimed is:

1. An electrical connector comprising:
   a holding device having a recess and at least one conductive pad disposed in the recess;
   a socket including
      at least one conductive pin configured to engage at least one of the conductive pads when the socket is inserted into the holding device, and
      a port configured to receive an interface of an external device;
   wherein the shape of the socket is complementary to the shape of the recess;
   the holding device having a first retaining element and the socket having a second retaining element that are together configured to releaseably maintain interconnection between the holding device and the socket; and
   wherein the first retaining element and the second retaining element are configured to release the socket and the holding device when a force outward from the holding device is applied to the port along a vector at a substantial offset angle from an axis of removal for the external device interface from the port, wherein the force is insufficient to cause damage to the port.

2. The electrical connector of claim 1 wherein
   the first retaining element is a recessed ring in a perimeter of the holding device, and
   the second retaining element is a complementary raised ring in a perimeter of the socket.

3. The electrical connector of claim 1 wherein
   the first retaining element is a raised ring in the perimeter of the holding device and separate from the holding device, and
   the second retaining element is a recessed ring in a perimeter of the socket.

4. The electrical connector of claim 1 wherein
   the first retaining element is a groove in the holding device, and
   the second retaining element is a complementary protrusion on the socket; and
   wherein the complementary protrusion and the groove are configured to maintain the orientation of the holding device and the socket when the socket and holding device are interconnected.

5. The electrical connector of claim 1 wherein
   the first retaining element is a protrusion on the holding device, and
   the second retaining element is a complementary groove in the socket; and
   wherein the complementary protrusion and the groove are configured to maintain the orientation of the holding device and the socket when the socket and holding device are interconnected.

6. The electrical connector of claim 1, further comprising:
   a printed circuit board that is electrically connected with the conductive pads;
   wherein the printed circuit board is in electrical connection with the port through the socket when the socket and holding device are interconnected.

7. The electrical connector of claim 6, wherein the at least one conductive pin is spring mounted.

8. The electrical connector of claim 7, wherein the port is a female USB connector.

9. The electrical connector of claim 7, wherein the port is a female audio connector.

10. An electrical connector comprising:
a holding device having a receiving area and at least one conductive pad disposed in the receiving area;
a socket including
   at least one conductive pin configured to engage at least one of the conductive pads when the socket is inserted into the receiving area of the holding device, and
   a port configured to receive an interface of an external device;
wherein the shape of the socket is complementary to the shape of the receiving area of the holding device; and
the holding device having formed in a perimeter thereof a first recessed ring and the socket having formed in a perimeter thereof a second recessed ring; and
a split ring spring disposed partially in each of the first recessed ring and the second recessed ring so as to secure the socket to the holding device.

11. The electrical connector of claim 10 wherein the split ring spring is configured to allow separation of the holding device and the socket when a sufficient force is applied to the socket.

12. A method of electrical connecting comprising:
providing a holding device having a recess and at least one conductive pad disposed in the recess;
providing a socket including
   at least one conductive pin configured to engage at least one of the conductive pads when the socket is inserted into the holding device, and
   a port;
wherein the shape of the socket is complementary to the shape of the recess;
interconnecting the socket with the holding device;
interconnecting an interface of an external device with the port;
wherein the holding device has a first retaining element and the socket has a second retaining element that together releaseably maintain the interconnection of the socket and the holding device; and
releasing the socket from the holding device when a force outward from the holding device is applied to the port along a vector at a substantial offset angle from an axis of removal for the external device interface from the port, wherein the force is insufficient to cause damage to the port.

13. The electrical connector of claim 12 wherein
the first retaining element is a recessed ring in a perimeter of the holding device, and
the second retaining element is a complementary raised ring in a perimeter of the socket.

14. The method of claim 12 wherein
the first retaining element is a raised ring in the perimeter of the holding device, and
the second retaining element is a recessed ring in a perimeter of the socket.

15. The method of claim 12 wherein
the first retaining element is a groove in the holding device, and
the second retaining element is a complementary protrusion on the socket; and
wherein the complementary protrusion and the groove are configured to maintain the orientation of the holding device and the socket when the socket and holding device are interconnected.

16. The method of claim 12 wherein
the first retaining element is a protrusion on the holding device, and
the second retaining element is a complementary groove in the socket; and
wherein the complementary protrusion and the groove are configured to maintain the orientation of the holding device and the socket when the socket and holding device are interconnected.

17. The method of claim 12 wherein a printed circuit board is electrically connected with the conductive pads; and
wherein the printed circuit board is in electrical connection with the port through the socket when the socket and holding device are interconnected.

18. The method of claim 17, wherein the at least one conductive pin is spring mounted.

19. The method of claim 18, wherein the port is a female USB connector.

20. The method of claim 18, wherein the port is a female audio connector.

* * * * *